(12) United States Patent
Lanzara et al.

(10) Patent No.: US 10,032,946 B2
(45) Date of Patent: Jul. 24, 2018

(54) ASSEMBLY FOR CONVERTING SOLAR RADIATION INTO ELECTRIC AND/OR THERMAL ENERGY

(75) Inventors: Giovanni Lanzara, Rome (IT); Gino D'Ovidio, Rome (IT); Francesco Crisi, Rome (IT); Carlo Masciovecchio, Rome (IT); Massimiliano Viola, Rome (IT); Carlo Tulli, Rome (IT); Fabrizio Berton, Rome (IT); Giuseppe Berducci, Rome (IT)

(73) Assignee: SOLERGY INC., Piedmont, CA (US)

( * ) Notice: Subject to any disclaimer, the term of this patent is extended or adjusted under 35 U.S.C. 154(b) by 700 days.

(21) Appl. No.: 13/885,423

(22) PCT Filed: Nov. 15, 2011

(86) PCT No.: PCT/IB2011/055100
§ 371 (c)(1),
(2), (4) Date: Jun. 24, 2013

(87) PCT Pub. No.: WO2012/066480
PCT Pub. Date: May 24, 2012

(65) Prior Publication Data
US 2015/0034143 A1   Feb. 5, 2015

(30) Foreign Application Priority Data
Nov. 16, 2010  (IT) .............. RM2010A0597

(51) Int. Cl.
*H01L 31/00* (2006.01)
*H01L 31/052* (2014.01)
(Continued)

(52) U.S. Cl.
CPC ............ *H01L 31/0524* (2013.01); *F24J 2/08* (2013.01); *G02B 7/003* (2013.01); *G02B 7/023* (2013.01);
(Continued)

(58) Field of Classification Search
CPC ............ H01L 31/0524; H01L 31/0543; H01L 31/052; F24J 2/08; F24J 2002/4665;
(Continued)

(56) References Cited

U.S. PATENT DOCUMENTS

| 3,696,238 A | 10/1972 | Szymanski |
| 4,280,853 A | 7/1981 | Palazzetti et al. |

(Continued)

FOREIGN PATENT DOCUMENTS

| EP | 0985871 A2 | 3/2000 |
| EP | 0994293 A2 | 4/2000 |

(Continued)

*Primary Examiner* — Thanh Truc Trinh
(74) *Attorney, Agent, or Firm* — Lucas & Mercanti, LLP

(57) ABSTRACT

A system or device for concentrating the light radiation of the type to be used for converting the solar radiation into electric current and/or thermal energy is disclosed. The device mainly having a primary optics apt to be exposed to the solar radiation and to allow the passage thereof therethrough, the primary optics being positioned on a hollow spacer member, which is perfectly aligned and at the same time locked, by means of a joint member.

20 Claims, 5 Drawing Sheets

(51) Int. Cl.
    *F24J 2/08*     (2006.01)
    *H01L 31/054*     (2014.01)
    *H02S 40/44*     (2014.01)
    *G02B 7/00*     (2006.01)
    *G02B 7/02*     (2006.01)
    *G02B 19/00*     (2006.01)
    *F24J 2/46*     (2006.01)

(52) U.S. Cl.
    CPC ..... *G02B 19/0028* (2013.01); *G02B 19/0042* (2013.01); *H01L 31/052* (2013.01); *H01L 31/0543* (2014.12); *H02S 40/44* (2014.12); *F24J 2002/4665* (2013.01); *Y02E 10/40* (2013.01); *Y02E 10/52* (2013.01); *Y02E 10/60* (2013.01)

(58) Field of Classification Search
    CPC ..... H02S 40/44; G02B 7/003; G02B 19/0028; G02B 19/0042; Y02E 10/40; Y02E 10/52; Y02E 10/60
    USPC .................................................. 136/243–293
    See application file for complete search history.

(56) References Cited

U.S. PATENT DOCUMENTS

| | | | | |
|---|---|---|---|---|
| 4,576,533 | A * | 3/1986 | Chartier | F16B 37/14 411/373 |
| 4,612,609 | A * | 9/1986 | Collins | F21S 48/1208 362/267 |
| 5,102,253 | A * | 4/1992 | Pugliesi-Conti | E04B 1/6137 403/31 |
| 5,476,553 | A * | 12/1995 | Hanoka | B32B 17/10036 136/251 |
| 6,020,554 | A | 2/2000 | Kaminar et al. | |
| 7,568,585 | B2 * | 8/2009 | Baughman | B65D 39/088 215/254 |
| 2008/0283116 | A1 | 11/2008 | Banin et al. | |
| 2009/0183762 | A1 * | 7/2009 | Jackson | H01L 31/02021 136/246 |
| 2009/0223555 | A1 | 9/2009 | Ammar | |

FOREIGN PATENT DOCUMENTS

| | | |
|---|---|---|
| FR | 2452792 A1 | 10/1980 |
| JP | 8249910 A1 | 9/1996 |
| WO | 2009/066720 A1 | 5/2009 |

* cited by examiner

ASSEMBLY FOR CONVERTING SOLAR RADIATION INTO ELECTRIC AND/OR THERMAL ENERGY

CROSS-REFERENCE TO RELATED APPLICATIONS

This application is a 371 of PCT/IB2011/055100, filed Nov. 15, 2011, which claims the benefit of Italian Patent Application No. RM2010A000597, filed Nov. 16, 2010, the contents of each of which are incorporated herein by reference.

TECHNICAL FIELD OF PRESENT INVENTION

The present invention places in the field of the solar energy exploitation. In particular, the present invention places in the field of the energy or solar radiation conversion into electric and/or thermal energy. More in details, the present invention relates to a device or system apt to convert energy or solar radiation into electric and/or thermal energy. Still more in details, the present invention relates ad a system or a device for generating electric and thermal energy by concentrating light or solar energy, said device or system comprising a primary optics (for example a lens) collecting the solar energy and converging it onto a high-efficiency photovoltaic cell by means of a secondary optics which, in turn, contributes to distribute the solar radiation onto the photovoltaic cell. Said device further comprises a spacer which functions as optic aligning member apt to guarantee the precise alignment and positioning of the primary optics with respect to the cell and/or the secondary optics. A thermal dissipation system further contributes to convey the heat generating into the cell onto a cooling (for example hydraulic) circuit, wherein the heated fluid can be used for different purposes, for example heating for civil use, cold production, desalination, etc.

DESCRIPTION OF THE STATE OF ART

In the state of art systems and/or devices for converting the solar radiation into current and/or electric energy are known. For example, the photovoltaic panels making use of silicon photovoltaic cells are known; in this case, the solar radiation incident onto the photovoltaic cells is transformed into electric current. Systems making use of so-called multi-junction cells (for example with triple junction) are also known; in particular, the multi-junction cells are able to convert a portion of the solar spectrum going from 350 nm to 1900 nm, whereas in case of silicon traditional cells the convertible solar energy spectrum is comprised between 40 nm and 900 nm. Furthermore, the multi-junction cells guarantee electric conversion efficiencies up to 38-40%, whereas the conversion efficiency guaranteed by the traditional silicon cells is definitely lower (about 14%). At last, the multi-junction cells are less sensible to the temperature than the traditional silicon ones and they can work at definitely higher temperatures, thus making possible a heat recovery.

An example of a concentration photovoltaic system of the type known in the state of art is represented in FIG. 1. As it is clear from FIG. 1, the elementary unit 10 of the photovoltaic system 100 represented therein comprises a primary optics 4 whereon the solar radiation incides. By means of the primary optics 4, the solar rays are made to converge onto the cell 6, positioned near the lens focus. The secondary optics 5 is used to homogenize the solar rays so as to lighten the cell 6 uniformly as much as possible, as well as to increase the device acceptance angle. The photovoltaic cell 6 is further positioned onto a heat dissipator 7 (in turn, arranged onto a support 8), said heat dissipator 7 thus preventing the cell overheating due to the strong light concentration inciding thereon (>40 W/cm$^2$). FIG. 1 further shows how the elementary units 10 are assembled so as to implement conversion modules 100 similar to the silicon modules. In particular, FIG. 1 shows how the modules 100 known in the state of art are constituted by a front parquet (exposed to the solar radiation) constituted by different primary optics 4 and by a rear basement containing the receivers with the relative cells in equal number to the primary optics.

In systems of this type the cell cooling is obtained by means of aluminium or copper metal plates, thermally connected to the rear metal surface of the module or panel. The module or panel is then cooled by means of the natural air circulation from outside.

The problems which are met when the panels or modules of the previously described type are different. In particular, a first problem is related to the fact that in the modules or panels known in the state of art the single elementary units cannot be accessed separately; and therefore, in case of lack of operation or erroneous operation of a single cell or elementary unit, it will be necessary to proceed with replacing the whole module or panel. A second problem is related to the fact that the working temperature of the photovoltaic cells and therefore of the modules will strongly depend upon both the outer temperature and the level of venting existing in that moment; however, this causes a high variability in the performances of the module itself, as for example a sudden change in cell temperature equal to 20% can correspond to a loss of absolute 2% of conversion efficiency of the cell itself. Another problem is due to the fact that the primary optics are generally constituted by Fresnel lenses made of plastic material hot moulded or silicone material moulded onto a plane glass plate of common photovoltaic use. However, this involves a limited time duration of the primary optics (following the UV degradation of the material involving, in turn, losses of optical efficiency and structural fragility), the occurrence in time of the yellowing phenomenon with consequent transmission reduction, as well as a fragility of the primary optics (damages due to hail or due to vandalistic acts), as the thickness of the plastic primary optics is few mm, thermal deformations of lenses (which can alter the geometry thereof and therefore the optical performances), thermo-mechanical deformations of the module (which can lead to the alignment loss in between primary optics and receiver and/or secondary optics, as well as the module sealing loss with consequent increase in the humidity tightness). At last, an additional serious problem which can be found in panels and in the solutions known to the state of art is related to the difficulty of aligning perfectly and correctly the various components, in particular the primary optics and/or the secondary optics and/or the photovoltaic cell. To this purpose, it is to be noted that it is necessary to guarantee the correct alignment of the component portions, in particular it is necessary to guarantee that the cell centre falls in the lens focal axis and that the distance between cell and lens is fixed, so as to optimize the incident flow and avoid light losses.

Therefore, an object of the present invention is to obviate the drawbacks mentioned previously and found in the solutions known in the state of art. In particular, the objects and the purposes of the present invention can be summed up as follows.

To propose a solution allowing to collect the incident solar radiation by means of a primary optics and conveying it with the maximum optical efficiency onto a high efficiency photovoltaic cell. To propose a high efficiency primary optics with maximum resistance to the ageing, yellowing and wear phenomena, due to the solar radiation and to the atmospherical agents. To implement an auto-collimating system which can be assembled in simple and quick way, and which allows aligning perfectly the lens or primary optics with the photovoltaic cell, by further guaranteeing the right focal distance (between primary optics and photovoltaic cell) as well as to arrange the centre of the photovoltaic cell along the optical axis of the primary optics, so as to optimize the collection or reception of the solar radiation in order to guarantee the cell maximum conversion efficiency. To implement a high efficiency secondary optics allowing to collect the maximum amount of light coming from the primary optics and allowing to uniform the flow incident onto the cell, both from the point of view of the intensity and of the spectrum.

The secondary optics will further allow to increase the system acceptance angle. To implement a base elementary unit, allowing to be repeated so as to be able to implement a module constituted by a plurality of base elementary units, with a high performance uniformity (and that is by avoiding marked differences in performances between the various base elementary units of a module or panel). To this purpose it has to be considered that, in case of a module or panel of the type represented in FIG. 1, the panel efficiency can be compared to the one of the base elementary unit with lower efficiency therefore the presence in each module or panel of low efficiency elementary units will have to be avoided. To implement base elementary units hermetically sealed towards the outside by avoiding the penetration of humidity, rain or similar agents inside the base elementary unit, thus by guaranteeing the protection of the cell and of the electric and thermal connections from the atmospherical agents, by avoiding condensation phenomena in the primary optics and then obtaining the maximum time duration of the system functionality. At last, an additional object of the present invention is to implement a system for cooling the photovoltaic cell which, apart from keeping the working temperature at levels of maximum efficiency of photoelectric conversion, allows recovering the heat produced through a suitable carrier to use it as thermal source for other applications. One further aims at implementing a closing/opening hermetic system of reversible type, that is with not destructive modes, able to allow the opening and hermetic re-closing of the concentration unit by means of self-centering and self-aligning mechanical systems, to perform easily a possible maintenance/replacement of the components of the same, by protecting, at the same time, the self-alignment and centering conditions thereof.

The objects or purposes mentioned and described previously will be achieved by a system for concentrating the light radiation of the type apt to be used for the conversion of the solar radiation into electric and/or thermal current as claimed in the main claim 1, as well as by a module or photovoltaic panel and by a photovoltaic plant as claimed in claims 16 and 17, respectively. Additional embodiments of the present invention are defined in the depending claims.

DESCRIPTION OF THE PRESENT INVENTION

The present invention can be applied in particular and conveniently in the field for converting energy or solar or light radiation into electric and/or thermal energy. In fact, the present invention offers and proposes a new solution for implementing the base elementary units used for implementing the photovoltaic panels apt to convert the solar or light radiation into electric current and/or thermal energy. Therefore, this is the reason therefor application examples of the present invention for implementing base elementary cells for photovoltaic panels will be described hereinafter. However, it is to be noted that the possible applications of the present invention are not limited to the case of the base elementary cells for photovoltaic panels. On the contrary, the present invention advantageously can be applied in all cases wherein it is necessary to align and position precisely different component portions of a system, for example lenses, mirrors or optical components in general. In fact, the present invention allows implementing optical systems (even not in the photovoltaic field) with reduced costs, by taking materials available on the market, according to a simplified manufacturing and assembling process with practically zeroed size or alignment or positioning tolerances.

The present invention bases upon the general concept that the advantages or drawbacks typical of the solutions known in the art (in particular of the photovoltaic modules or panels known in the art) can be overcome or at least minimized by implementing a system or device for concentrating the light or solar radiation of the type apt to be used for converting the solar radiation into energy or electric current and/or thermal energy (practically a base elementary unit for implementing and assembling photovoltaic panels or modules) by means of a spacing supporting member, whereon a primary optics with predefined shape is placed, as well as by means of an alignment and self-centering member, with predefined shape too, able to centre said primary optics on said supporting member and in particular to bring the symmetry longitudinal axis of said primary optics to coincide with the symmetry longitudinal axis of said supporting member. Furthermore, additional advantages will be obtained by equipping the supporting member and the alignment member with fastening or locking means apt to allow locking the alignment member onto the supporting member. In fact, as the primary optics is compressed between the alignment member and the supporting member, by simple pressing the alignment member on the supporting member the contemporary alignment and the fastening of the primary optics on the supporting member will be obtained. A perfect sealing and thus protection of the component portions inside the supporting member (in particular of the photovoltaic cell) will be further obtained by making use of a sealing member interposed between the primary optics and the supporting member, as in this way the inside of the supporting member will be perfectly sealed from outside.

BRIEF DESCRIPTION OF THE FIGURES

Hereinafter, the present invention will be clarified by means of the description of some embodiments thereof represented in the enclosed drawing figures. However, it is to be noted that the present invention is not limited to the embodiments represented in the drawing figures; on the contrary, all variants or modifications of the represented embodiments, which will appear clear, obvious and immediate to the person skilled in the art, fall within the scope and the object of the present invention. In particular, in the enclosed drawing figures.

DETAILED DESCRIPTION OF SOME EMBODIMENTS OF THE PRESENT INVENTION

Figure 1:
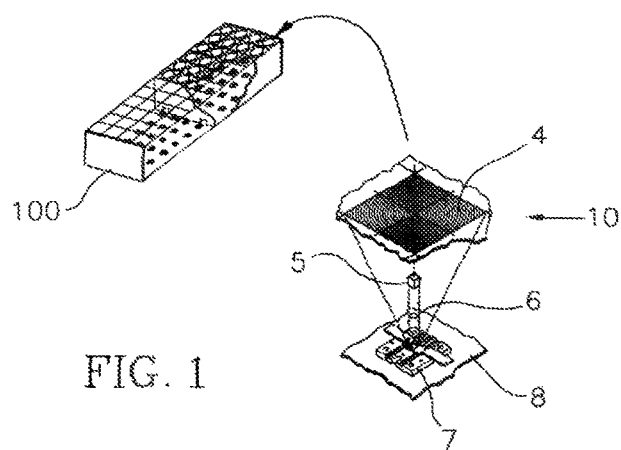
FIG. 1 shows an exposed view of a photovoltaic ring or module of the type known in the state of art.
Figure 2:
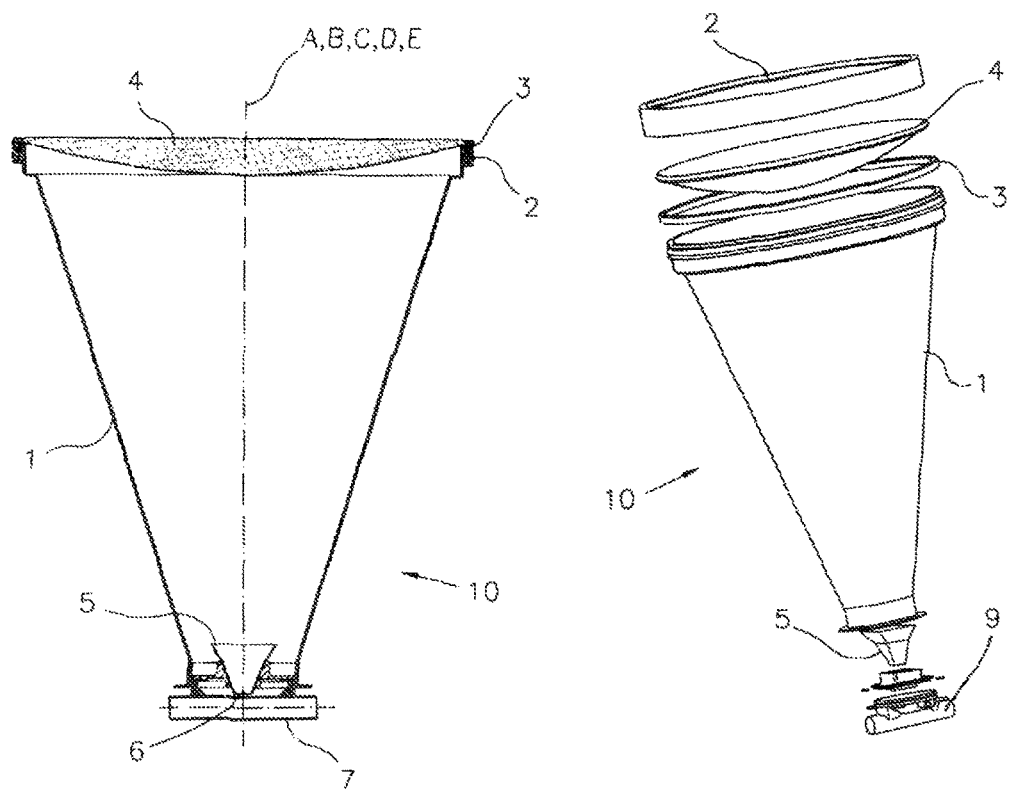
FIG. 2 shows a longitudinal section view of an embodiment of the present invention.
Figure 3:
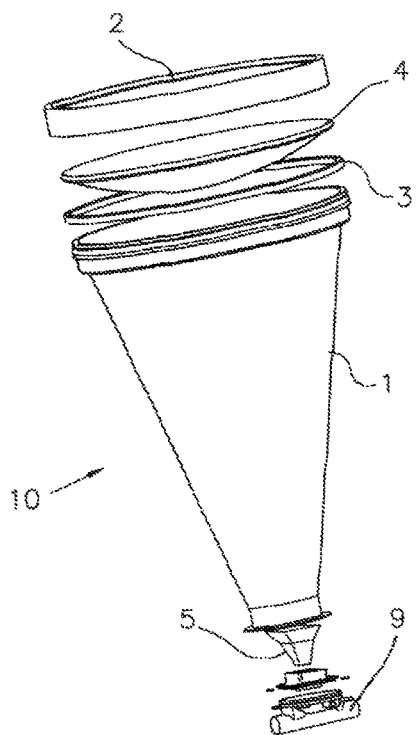
FIG. 3 shows an exposed perspective view of the embodiment of the present invention represented in FIG. 2.

In FIGS. 2 and 3, the device or system according to the embodiment of the present invention represented therein (practically the elementary or base unit for assembling and implementing photovoltaic panels or modules) is represented by means of the reference number 10. Said device or system 10, comprises in particular a primary optics 4, for example made of highly transparent glass or other transparent material, resistant to environment degradation forms, a secondary optics 5, a spacer or alignment member 1, a mechanical closure and joint member e 2 to align the primary optics 4 to the spacer 1 and to keep it in fixed position on the spacer 1, as well as a receiver constituted by a photovoltaic cell 6 mounted on a support 9 allowing to dissipate the heat generated by the cell 6 and which even plays a function of sealing the rear portion of the spacer 1, and at last a hydraulic cooling circuit 7. FIG. 2 shows in particular the mutual position of the component portions of the system or device 10 under the completed assembly condition, and that is under the condition wherein the component portions are perfectly aligned in the operation mutual position. Therefore, the symmetry longitudinal axes A, B, C, D and E, respectively of the spacer 1, of the primary optics 4, of the mechanical closure and joint member 2, as well as of the secondary optics 5 and of the cell 6 will be substantially coincident.

In particular, the primary optics 4 has a circular plan and, according to the needs and/or circumstances, could be replaced by an aspherical refractive member, for example made of highly transparent glass, and therefore which does not have aspherical aberration and it offers high performances in terms of chemical stability and mechanical resistance. The above-mentioned primary optics 4 is positioned at the upper opening of a spacer 1. Said spacer 1 or supporting member of the primary optics 4 (of the lens) is substantially hollow and with tubular and symmetrical shape with respect to the longitudinal (for example cylindrical or truncated conical) axis thereof A and it could be implemented with suitable materials, for example aluminium by means of precision deep-drawing process. The spacer 1, as previously mentioned in advance, will have the function of optically aligning and protecting the system (in particular the component portions placed inside the spacer 1) from the environmental agents and it will be so as to guarantee an adequate parallelism and concentricity between its own front openings (wherein the primary optics 4 is places) and rear openings (near thereof the secondary optics 5, the cell 6 and the related support 9, as well as the cooling circuit 7 are placed), so as to guarantee the alignment between the primary optics 4 and the secondary optics 5 and the photovoltaic cell 6, along its own symmetry longitudinal axis A, coinciding with the optical axis of the whole device or system 10. The spacer 1 will further guarantee that the lens 4 and the photovoltaic cell 6 are kept in position at the correct distance. The front opening of the spacer 1 (the one thereon the lens 4 is positioned) will further shaped (see the following description) so as to unite with the locking and/or alignment and/or self-centering device 2 so as to guarantee, apart from the correct positioning of the lens 4, even the hermetic sealing of the system or device 10. At last, the rear opening of the spacer 1 (opposite to the one thereon the lens 4 is positioned) is shaped so as to unite with the underneath receiver (constituted by the photovoltaic cell 6 and by the relative support 9) so as to guarantee the correct positioning of the receiver and thus the alignment of the cell 6, as well as the hermetic sealing of the rear portion of the spacer 1.

Figure 10:
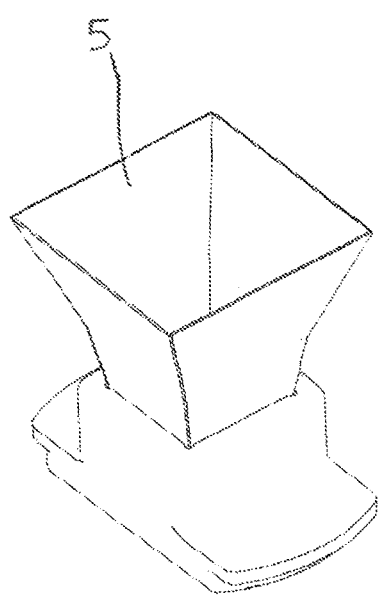
FIG. 10 shows a perspective view of an additional component of an embodiment of the present invention.

In the embodiment of the device or system according to the present invention represented in FIGS. 2 and 3, the secondary optics 5 is constituted by a pyramidal truncated hollow member the wall's tilting therewith will be each time chosen and determined according to the needs and/or circumstances, and the inner surface thereof is highly reflecting so as to convey and homogenizing the light beams coming from the primary optics 4 onto the underneath cell 6 and so as to further compensate the chromatic aberration. For example, the secondary optics 5 could comprise a supporting hollow structure made of aluminium, on the inner walls thereof sheets made of a highly reflective composite material are applied. Furthermore, still according to the needs and/or circumstances, the sheets made of composite material could be configured so as to have at the incident rays a double tilting (see FIG. 10). The secondary optics 5 could further be implemented so as to obtain the following effects: (a) transformation of the circular profile of the light beam coming from the primary lens 4 into a squared profile of the same area and shape of the underneath cell 6 so that the cell itself 6 is invested integrally and uniformly by the incident light; (b) compensation of the chromatic aberration produced by the lens as if one considers the with spectral range wherein the system will operate, one understands how the light rays having different wavelengths have different focal distances due to the dependence from refraction index of the glass (of the primary optics 4) from the radiation wavelength therefore it is necessary to convey by means of suitable reflections the light rays coming from the primary lens 4, the wavelength thereof is so as to have focal distance different from the nominal one and which then would go out of the focal plane of the underneath cell 6; (e) increase in the acceptance angle of the device or system 10; (d) non-deformation and/or deterioration by thermal effect even in situations wherein the device or system should find out of the axis and all concentrated radiation should incide onto a single reflecting face thereof.

The device or mechanical closure and joint member 2 (hereinafter also defined as alignment and/or self-centering member) provides the alignment of the primary optics 4 on the spacer 1, to keep in position the primary optics 4 onto said spacer 1, as well as to close and seal the front opening of the spacer 1 (by means of the lens 4 and in case with the help of a sealing member, for example an O-ring). For example, according to the needs and/or circumstances, the joint member 2 could be made of composite material with the thermal dilatation coefficient intermediate between the one of the material of the primary lens 4 and that of the material of the spacer 1, by means of precision hot moulding. The chosen material will allow to absorb the thermal dilatation differential which can show between the spacer 1 and the primary optics 4 under operating conditions of high outer temperature.

The receiver, positioned at the rear opening of the spacer 1, could be constituted by a support 9, for example in die-cast aluminium, whereon the photovoltaic cell 6 is positioned, said support 9 being able to be in case integrating portion of the cell cooling circuit. In the example represented in FIGS. 2 and 3, the cooling circuit 7 of the cell 6 comprises a pipe to be joined to a main piping apt to contain a cooling fluid, for example water or similar cooling liquids. In particular, the support 9 will be designed and implemented so as to unite mechanically and with precision with the above spacer 1 (with the lower opening thereof) so as to guarantee, as previously anticipated, the positioning of the cell 6 in the centre of the optical axis of the system 10 (and thus in the centre of the symmetry longitudinal axis A of the spacer 1) and therefore so as to guarantee, in case by means of using a specific sealing 12, the hermetic sealing of the lower portion of the spacer 1. The tight connection of the support 9 to the spacer 1 furthermore is guaranteed by a closure of the "bayonet" type, made possible thanks to the presence of three projections 13A, 13B, 13C localized on the top of said support 9 and corresponding cavities obtained in the lower portion of the spacer 10. The structure of the support 9 is crossed by two mutually opposed metallic pins 14A, 14B concurring in implementing the electric connection to the cell 6. Between the two metallic pins 14A, 14B and the support 9 a layer of vulcanized plastic material is interposed, destined to implement at the same time an efficient sealing of the device or system 10 and an optimum electric insulation between the same pins 14A, 14B and the support 9. The photovoltaic cell 6 will band then positioned onto the inner surface of the support 9 (the one faced towards the primary optics 4) and it will be connected mechanically and thermally thereto by means of a suitable glue, thermically conductible and electrically insulating which will allow to keep the cell positioned and centred in the operation position, to guarantee the electric insulation between the cell and the support 9 and to guarantee the maximum heat exchange between the cell 6 and the support 9 to avoid dangerous overheating of the cell itself and to transfer the maximum possible heat amount to the dissipator and then to the cooling circuit 7.

Hereinafter, by referring to FIGS. 4a e 4b, the fundamental operation principles of the system or device according to the present invention will be explained.

Figure 4A:
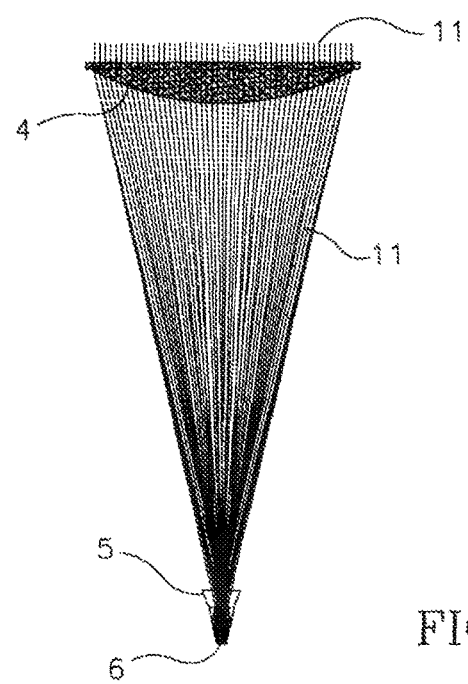
FIG. 4a clarifies in schematic form the operation of the present invention.
Figure 4B:
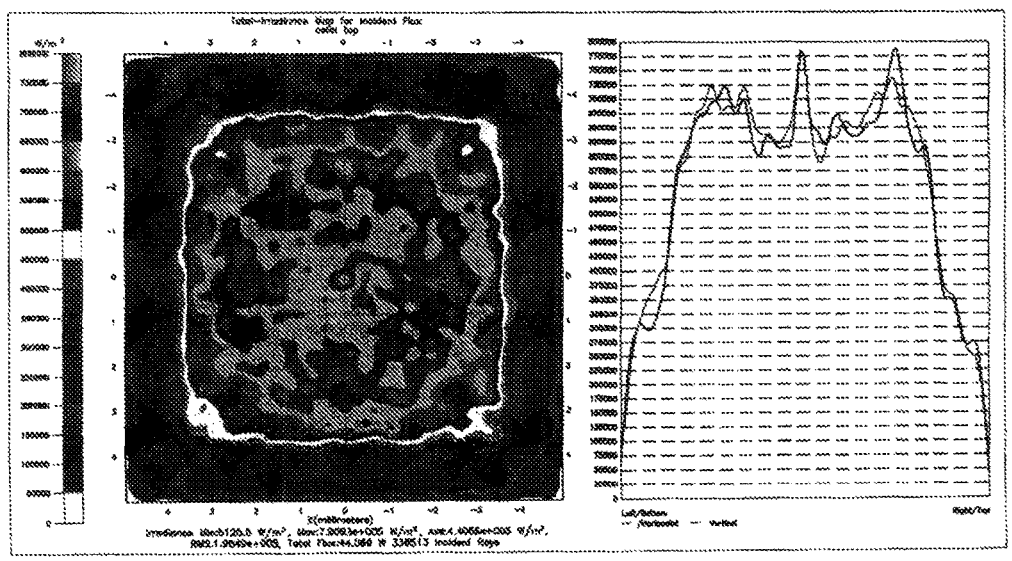
FIG. 4b shows the results which can be obtained by means of the present invention.

As represented in FIG. 4a, the solar rays 11 incident onto the primary optics or primary lens 4 cross said primary optics 4 and are conveyed from the same primary optics 4 towards the secondary optics 5. The rays 11 then enter the secondary optics 5 through the upper opening thereof (faced towards the primary optics 4), they struck the reflecting inner walls of the secondary optics 5 and are then reflected until going out from the secondary optics 5 through the lower opening thereof (opposite to the upper opening thereof) going then to struck or involve the underneath cell 6. Thanks to the features of the secondary optics 5 mentioned previously, the light rays outgoing from the secondary optics 5 will be distributed onto the underneath cell uniformly, thus by guaranteeing the maximum exploitment of the cell and the maximum efficiency or yield in terms of conversion of the light radiation into energy and/or electric current. FIG. 4b shows in detail the uniformity of the light radiation intensity inside the cell area. At last, it will be possible to minimize the effects of the chromatic aberration.

Hereinafter, by referring to FIGS. 5 to 6, additional details of the system or device according to the present invention will be explained or clarified; in FIGS. 5 to 6, the features or component portions which have been already described previously by referring to other figures, are identified by the same reference numerals.

Figure 5:
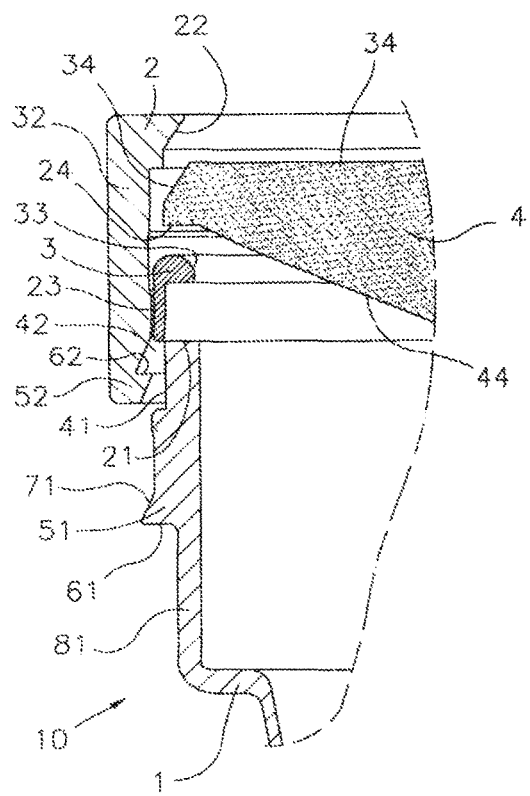
FIGS. 5 to 7 show details or particulars of an embodiment of the present invention.
Figure 6:
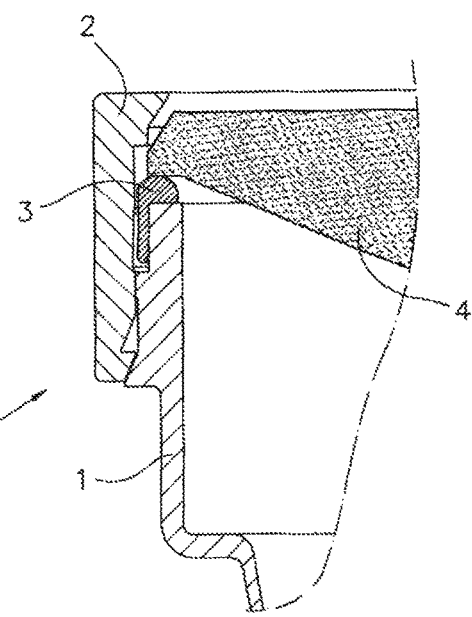
Figure 7:
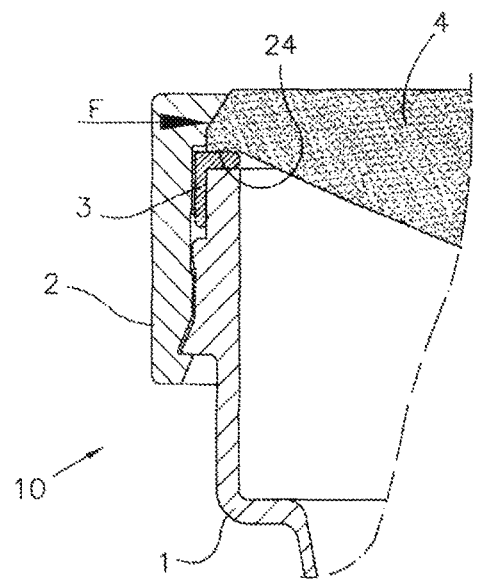
Figure 8:
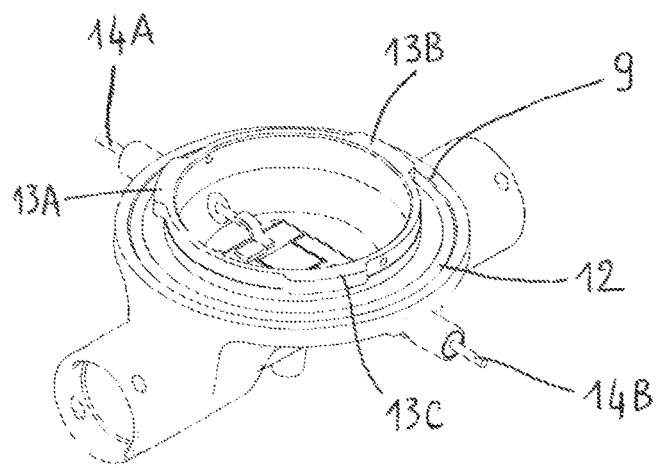
FIGS. 8 and 9, respectively, show a perspective view and a section view related to a component of an embodiment of the present invention.
Figure 9:
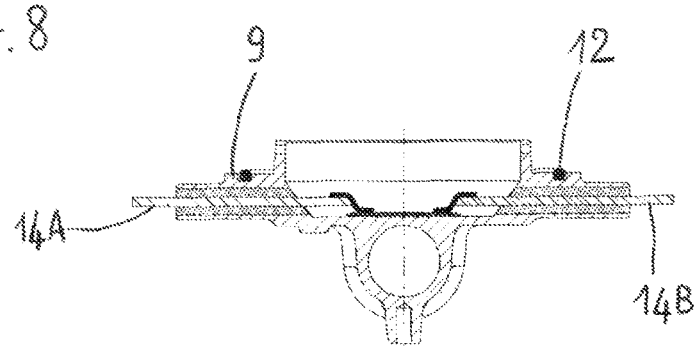

FIG. 5 shows clearly that the primary optics 4 comprises a first substantially plane front surface 34, apt to be exposed to the radiation, and an internal or inner surface 44, opposite to said first front surface 34 is substantially convex with ashperical bend. The primary optics 4 has a circular plane with a longitudinal symmetry axis B substantially perpendicular to the surface (to this purpose see FIG. 2). The primary optics or primary 4 further comprises an annular resting surface 24, apt to be rested onto an annular resting surface 21 of the spacing member 1. In the example of FIGS. 5 to 7, said resting surface 24 is substantially plane and therefore parallel to the exposed surface 34 of the lens 4; however, according to the needs and/or circumstances, the annular resting surface 24 could follow the convex profile of the surface 44. In this case, even the resting surface 21 of the spacer 1 could have a corresponding convex profile. The primary optics 4 further comprises a truncated conical or tapered radial annular surface 34 and thus tilted with respect to the symmetry longitudinal axis B of the optics 4 of a predefined solid angle 5 extending from the plane outer surface 34. A peripheral radial surface substantially parallel to the symmetry longitudinal axis B unites at last the truncated or tapered surface 34 and the annular resting surface 24. With respect to the spacer 1, it is to be noted that the same comprises an ending annular portion 81, the inner surface thereof is substantially cylindrical and which extends substantially parallelly to the symmetry longitudinal axis B. Said ending annular portion 81 indeed defines the resting surface 21, and comprises a projection 51 extending radially outwardly from said annular portion 81. Said projection further comprises a truncated or tapered peripheral radial surface 71, therefrom an abutment or contrast surface 61 extends, which is substantially plane and perpendicular to the symmetry longitudinal axis B. At last, on the outer surface of said annular portion 81, near the resting surface 21, an indentation or housing 41 is obtained which extends for the whole outer circumference of the annular portion 81. In FIGS. 5 to 7 a sealing annular member 3 is furthermore represented, apt to be interposed between the primary optics 4 and the spacer 1, in particular between the resting annular surface 24 of the primary optics 4, and the corresponding surface of annular support 21 of the spacer 1. To this purpose, the sealing member, for example an O-ring made of rubber or however an elastic material, comprises a portion 33 extending substantially towards the inside of the spacer 1, and therefore in direction substantially perpendicular to its own symmetry longitudinal axis, as well as a second portion 23 extending from said first portion 33 in direction substantially parallel to the symmetry longitudinal axis of the sealing annular member 3. The portion 33 is apt to be comprised between the surfaces 24 and 21 respectively of the primary optics 4 and of the spacer 1, whereas the portion 23 is apt to be received and housed in the housing 41 obtained on the outer surface of the annular portion 81 of the spacer 1. The system further comprises an alignment and self-centering member (mechanical closing and joint member) 2, which as it will be explained hereinafter, is used to centre the primary optics 4 on the spacer 1 and to fasten the primary optics 4 on the same spacer 1. To this purpose, the joint member 2 comprises an annular main body 32 extending in direction substantially parallel to its own symmetry longitudinal axis C. Furthermore, the main body 32 defines a tapered inner radial surface (faced towards the symmetry axis C), thus tilted towards the symmetry axis C of a predefined solid angle. In particular, the tapered radial surface 22 of the joint member 2 will be substantially parallel to the tapered peripheral radial surface 34 of the primary optics 4. At last, the main annular body 32 of the joint member 2, near the lower portion thereof 52 has an engagement seat 42 defining an annular and substantially plane engagement surface 62, perpendicular to the symmetry axis C, therefrom a tapered or truncated conical surface extends substantially parallel to the tapered or truncated conical surface 71 of the projection 51 of the spacer 1. The action of the component portions described previously, in particular of the spacer 1, of the sealing 3, of the primary optics 4 and of the joint member 2 can be summarized as follows. The assembly of the system or of the 10 starts by arranging the involved portions as represented in the FIGS. 5 and 6, and therefore with the sealing member 3 rested onto the supporting surface (with the portion 33 rested onto the surface 21 and the portion 23 received in the housing 41), with the primary optics 44 rested onto the sealing 33 (substantially so that the surface 24 is in contact with the portion 33 of the sealing 3) and therefore with the portion or annular portion 81 of the spacer 1 received and housed in the annular main body 32 of the joint member 2. Subsequently, the joint member 2 is further approached to the primary optics 4 so that the tapered surface 22 of the joint member 2 abuts with the corresponding tapered surface 34 of the primary optics 4. By pushing the annular joint 2 against the primary lens 4, the contrast between the corresponding abutment surfaces 22 and 34 will produce a radial force F directed towards the centre of the lens 4 which will act onto the primary lens itself and then by causing in case motions of the lens 4 in the radial direction so that the primary lens 4 will align perfectly to the spacer 1, in particular so that the respective symmetry longitudinal axes A and B will coincide. The pressure exerted onto the primary lens 4 by means of the joint member 2 will be transferred at least partially to the sealing member 3, therefore the portion 33 of the sealing member 3 will be crushed and deformed as shown in FIG. 7, therefore by guaranteeing the hermetic sealing of the system or device, thus by avoiding that atmospherical agents such as for example humidity, rain and the like, can penetrate inside the spacer 1, by further guaranteeing the possibility of inserting inside the concentration unit, inert gases (for example, nitrogen, etc.) and/or implementing vacuum conditions, depressions or overpressures. The pressure exerted onto the lens 4 by means of the joint member 2, and the consequent deformation of the sealing deriving therefrom will allow the joint member 2 to reach a position (that of FIG. 7) with respect to the spacer 1, wherein the engagement seat 42 of the joint member 2 will find at (at the same height) the projection 51 of the spacer 1. To this purpose it is to be noted that, by moving the joint member 2 downwards in FIGS. 5 do 7, the end 52 of the main annular body 32 of the joint member 2 at first will be in contact to the tapered surface 71 of the projection 51. The radial force towards outside generated in this way will cause a deformation towards the outside of the lower end 52 of the main annular body 32, deformation which will be possible thanks to the elastic nature of said main annular body 32 (or at least of the end portion thereof 52). When then at last the end portion 52 has overcome the projection 51, in particular when the engagement surface 62 has overcome the engagement surface 61, the elastic nature of the annular main body 32 (or at least of the end portion thereof 52) will be so that the main annular body 32 assumes again the original nature form, so that the projection 51 is housed in the engagement seat 42 and the engagement surfaces 62 are 61 are in contact. In this way the alignment of the primary optics 4 with respect to the spacer 1 (so that the respective symmetry longitudinal axes B and A substantially coincide) and the locking of the primary optics 4 on the spacer 1 in the alignment position will be obtained, as well as the hermetic closure of the spacer 1, or at least of the upper opening thereof, by means of the sealing member 3. The accidental misalignment and the accidental uncoupling of the primary optics 4 from the spacer 1 will be then avoided. However, on the contrary, if it is necessary, for example, obtaining access inside the spacer 1, it will be sufficient to unlock and remove the joint member 2 and the primary optics 4; the unlocking will be however a quite simple and quick procedure, as it will simply require the disengagement of the projection 51 from the engagement seat 42.

Figure 11:
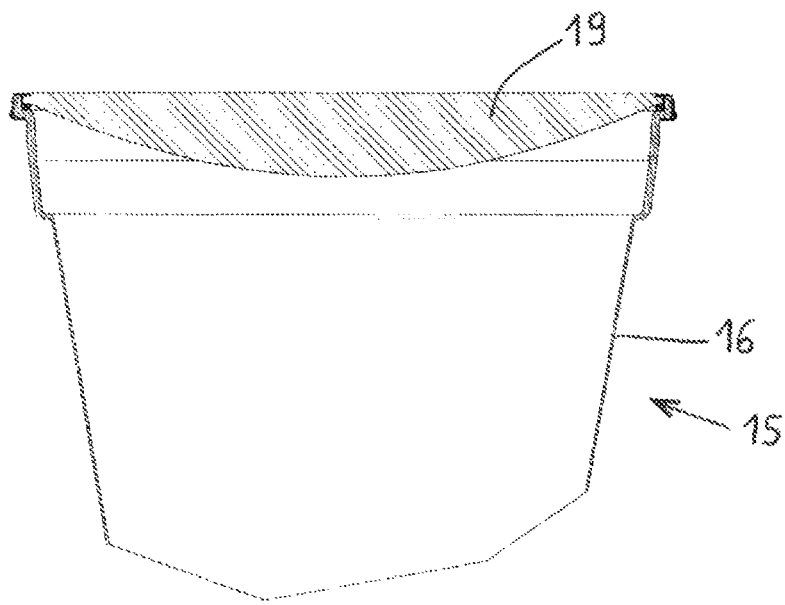
FIGS. 11 and 12 show details or particulars of an additional embodiment of the present invention.
Figure 12:
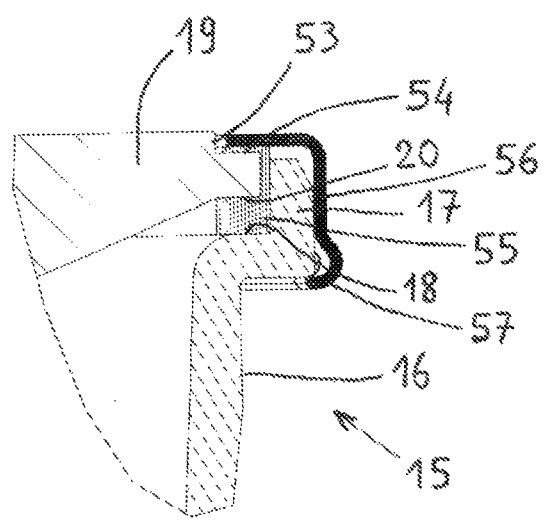

In FIGS. 11 and 12, the device or system according to the additional embodiment of the present invention represented therein is designated with the reference numeral 15. In this case, the spacer 16 has, on the top, a projecting portion 17 extending radially towards the outside and having a substantially "L"-like longitudinal profile defining an annular inner surface 18 orthogonal to the symmetry axis of said spacer 16.

The primary lens 19 of the device or system 15, instead, has peripherally an annular lower surface 20 orthogonal to the symmetry axis of said lens 19 and an upper indentation 53 with "L"-like longitudinal profile developing along the whole outer circumference of the primary lens 19, thus defining a related annular upper surface 54 parallel to the annular lower surface 20.

La second embodiment of the present invention illustrated in FIGS. 11 and 12 and described in this case further provides the use of an annular sealing 55, with longitudinal profile substantially shaped like a "C", apt to be put on outside the primary lens 19, so as to embrace both the annular upper surface 54 and the annular lower surface 20 of said primary lens 19, and to be interposed between the latter and the spacer 16, by means of related insertion inside the projecting portion 17 until going in abutment with the annular inner surface 18.

The mechanical closure and joint member 56, arranged for the alignment of the primary lens 19 on the spacer 16 and for mutually fixing the last two members, has an annular development and a longitudinal profile substantially shaped like an overturned "L" with an elastic portion of lower end 57 shaped like a hook. In particular, the alignment and the closure mentioned above are obtained by inserting the mechanical closure and joint member 56 on the top of the spacer 16 until bringing the upper portion thereof in abutment with the portion of the sealing 55 coinciding with the annular upper surface 54 of the primary lens 19, so as to determine the hooking, or the snap connection, of the lower portion thereof 57 with the projecting portion 17 of the spacer 16, thanks indeed to the elastic nature of the same mechanical closure and joint member 56.

In this second embodiment of the invention, the alignment between the primary lens 19 and the spacer 16 is then obtained by means of positive connection implemented by said lens 19, said spacer 16 and the sealing 55 interposed thereto.

Therefore, by means of the detailed description of the embodiments represented in the drawing figures, it was demonstrated that the present invention allows to achieve the pre-established objects and to overcome or at least minimize the drawbacks typical of the systems or devices known in the state of art. In particular, it was demonstrated that the system according to the present invention allows a reliable mutual alignment and positioning of the spacer and of the primary optics. The precise and reliable alignment of the secondary optics and of the photovoltaic cell is further guaranteed by the supporting member which carry out then functions similar to the ones carried out by the joint member. Furthermore, by choosing in a suitable way the materials for the primary optics, the same will guarantee maximum resistance to the ageing phenomena due to the solar radiation and to the atmospherical agents. The spacer will guarantee the stiffness necessary to avoid accidental misalignments, for example due to wind, to the thermal dilation of the materials and to similar phenomena. The secondary optics will further guarantee that the maximum light quantity coming from the primary optics invests a photovoltaic cell, and furthermore that a photovoltaic cell is invested by the light rays uniformly.

It was further shown the possibility of implementing a casing with hermetic sealing casing with possibility of maintaining inside thereof inert gases with pre-fixed pressure and/or implementing vacuum conditions, depression or overpressure, as well as the possibility of opening/closing the concentration unit by means of mechanical systems with operation of the reversible that is not destructive operation.

The set of the primary optics and of the secondary optics will further allow to increase the acceptance angle of the system or device. The system or device according to present invention can further be used conveniently as base elementary unit for implementing photovoltaic panels or modules. In case the sealing member is used, the perfect sealing of the systems will be further obtained and therefore it will be avoided that humidity or rain can penetrate inside and the deteriorate the inner component portions. At last, the heat generated by the could be conveniently exploited and recovered and be then used as thermal source for other applications, for example for civil heating. In fact, in case of a photovoltaic system constituted by several hundreds of devices according to the present invention, the heat produced by each device will be summed to the one produced from all the other ones by producing a thermal state and a temperature of the cooling liquid temperature sufficiently high so as to allow the use thereof as heat carrier for civil uses of various kind such as conditioning and/or heating.

It is important to note that the present invention is not limited to the embodiments described previously and represented in the drawing figures. On the contrary, within the scope of the present invention there are all variants and modifications of the embodiments described and represented which will appear clear to the persons skilled in the art. For example, the present invention is not limited to the materials mentioned in the previous description, but it comprises all the materials equivalent thereto. In the same way, still according to the present invention, avoiding the use of the sealing member will be also possible, for example in the cases and circumstances wherein the particularly advantageous use conditions (lack of humidity and rain) are so that to make unnecessary the hermetic sealing of the system. The object and the scope of the present invention are then defined by the claims.

The invention claimed is:

1. A system or device for concentrating the light radiation of the type apt to be used for converting the solar radiation into electric current and/or thermal energy, said system comprising a primary optics with circular plane made of a transparent material and configured to define a front surface, an inner surface, and a peripheral annular surface, the primary optics having a symmetry longitudinal axis (B) and being apt to allow a passage there through of the light radiation, a tubular hollow supporting member with circular cross-section having a symmetry longitudinal axis (A), said supporting member being apt to support said primary optics, an alignment and self-centering member with annular shape configured to define a radial surface parallel to the peripheral annular surface of the primary optics, the alignment and self-centering member having a longitudinal symmetry axis (C) and apt to be pushed against said primary optics and to align and self-center said primary optics with respect to said supporting member, and a sealing member interposed between said primary optics and said supporting member so as to guarantee an adherence between said primary optics and said supporting member so as to obtain an hermetic sealing of the system, wherein the alignment and self-centering member comprises a main body defining a tapered inner radial surface tilted towards the longitudinal symmetry axis (C) of the alignment and self-centering member of a predefined angle, the main body being further provided with an engagement seat and a lower end portion of deformable nature, the engagement seat defining an annular and planar engagement surface perpendicular to the longitudinal symmetry axis (C) and a tapered surface extending from the annular and planar engagement surface, wherein the supporting member comprises a projecting portion with a tapered surface, the projecting portion being configured in such a way that in an assembly configuration the projecting portion is received in the engagement seat and the tapered surface of the projecting portion engages to the tapered surface of the engagement seat, thereby fastening said alignment and self-centering member and said primary optics to said supporting member in said assembly configuration, and wherein in said assembly configuration the radial surface of the alignment and self-centering member pushes against the peripheral annular surface of the primary optics, thereby producing a radial force directed towards the center of the primary optics so that the respective longitudinal symmetry axes (A) and (B) of the primary optics and of the supporting member coincide and at the same time the produced force is at least partially transferred to the sealing member that is deformed to guarantee an hermetic sealing between the primary optics and the supporting member.

2. The system as claimed in claim 1, wherein said supporting member comprises a supporting surface with annular shape and apt to come in contact with the corresponding surface with annular shape of said primary optics so as to support said primary optics.

3. The system as claimed in claim 1, further comprising a secondary optics housed inside said supporting member.

4. The system as claimed in claim 3, wherein said secondary optics comprises a hollow body with a reflecting inner surface and with an inlet opening faced towards said primary optics and an outlet opening opposed to said inlet opening, so that the light radiation passing through said primary optics enters said hollow body of said secondary optics through said inlet opening and outgoes from said hollow body through said outlet opening.

5. The system as claimed in claim 3, further comprising at least a photovoltaic cell positioned at said outlet opening of said secondary optics and apt to transform at least partially the light radiation outgoing from said secondary optics through said outlet opening of said hollow body into electric current.

6. The system according to claim 5, further comprising means apt to transfer the heat produced by said at least a photovoltaic cell, so as to keep the operating temperature of said at least a photovoltaic cell inside a pre-defined range.

7. The system according to claim 5, further comprising means for transferring heat comprises means apt to utilize the heat dissipated from said at least a photovoltaic cell.

8. The system according to claim 1, wherein said system implements a casing with hermetic sealing with possibility of keeping inside thereof inert gases with positive or negative prefixed pressure and to implement partial or total vacuum conditions.

9. A photovoltaic module or panel comprising a plurality of systems as claimed in claim 1.

10. A photovoltaic plant comprising one or more modules or panels as claimed in claim 9.

11. The system as claimed in claim 1, wherein the supporting member comprises at an end proximate the primary optics, an indentation on a radially outer surface, at least a portion of the sealing member being received between the indentation and the main body of the alignment and self-centering member.

12. The system as claimed in claim 11, wherein said inner surface of said primary optics including an annular resting surface facing an annular surface of said supporting member and the sealing member includes:
    a first portion disposed between an annular resting surface of the supporting member and the annular resting surface of the primary optics; and
    a second portion disposed between the indentation and the main body of the alignment and self-centering member.

13. A system or device for concentrating the light radiation of the type apt to be used for converting the solar radiation into electric current and/or thermal energy, said system comprising
    a primary optics with circular plane made of a transparent material and configured to define a front surface, an inner surface, and a peripheral annular surface, the primary optics having a symmetry longitudinal axis (B) and being apt to allow a passage there through of the light radiation,
    a tubular hollow supporting member with circular cross-section having a symmetry longitudinal axis (A), said supporting member being apt to support said primary optics, said inner surface of said primary optics including an annular resting surface facing an annular surface of said supporting member,
    an alignment and self-centering member with annular shape configured to define a radial surface parallel to the peripheral annular surface of the primary optics, the alignment and self-centering member having a longitudinal symmetry axis (C) and apt to be pushed against said primary optics and to align and self-center said primary optics with respect to said supporting member, and
    a sealing member interposed between said primary optics and said supporting member so as to guarantee an adherence between said primary optics and said supporting member so as to obtain an hermetic sealing of the system,
    wherein the alignment and self-centering member comprises a main body defining a tapered inner radial surface tilted towards the longitudinal symmetry axis (C) of the alignment and self-centering member of a predefined angle,
    said alignment and self-centering member being fastened to said supporting member in an assembly configuration,
    wherein in said assembly configuration the radial surface of the alignment and self-centering member pushes against the peripheral annular surface of the primary optics, thereby producing a radial force directed towards the center of the primary optics so that the respective longitudinal symmetry axes (A) and (B) of the primary optics and of the supporting member coincide and at the same time the produced force is at least partially transferred to the sealing member that is deformed to guarantee an hermetic sealing between the primary optics and the supporting member, and
    wherein the supporting member comprises an indentation on a radially outer surface at an end proximate the primary optics, and the sealing member is L-shaped and includes a first portion disposed between the annular resting surface of the supporting member and the annular resting surface of the primary optics in a longitudinal direction and a second portion disposed between a lateral surface of the indentation and a lateral surface of the main body of the alignment and self-centering member.

14. The system as claimed in claim 13, wherein said supporting member comprises a supporting surface with annular shape and apt to come in contact with the corresponding surface with annular shape of said primary optics so as to support said primary optics.

15. The system as claimed in claim 13, further comprising a secondary optics housed inside said supporting member.

16. The system as claimed in claim 15, wherein said secondary optics comprises a hollow body with a reflecting inner surface and with an inlet opening faced towards said primary optics and an outlet opening opposed to said inlet opening, so that the light radiation passing through said primary optics enters said hollow body of said secondary optics through said inlet opening and outgoes from said hollow body through said outlet opening.

17. The system as claimed in claim 15, further comprising at least a photovoltaic cell positioned at said outlet opening of said secondary optics and apt to transform at least partially the light radiation outgoing from said secondary optics through said outlet opening of said hollow body into electric current.

18. The system according to claim 17, further comprising means apt to transfer the heat produced by said at least a photovoltaic cell, so as to keep the operating temperature of said at least a photovoltaic cell inside a pre-defined range.

19. The system according to claim 17, further comprising means for transferring heat comprises means apt to utilize the heat dissipated from said at least a photovoltaic cell.

20. The system according to claim 13, wherein said system implements a casing with hermetic sealing with possibility of keeping inside thereof inert gases with positive or negative prefixed pressure and to implement partial or total vacuum conditions.

* * * * *